(12) United States Patent
Chang

(10) Patent No.: US 7,224,225 B2
(45) Date of Patent: May 29, 2007

(54) DIFFERENTIAL INDUCTOR BASED LOW NOISE AMPLIFIER

(75) Inventor: Yuyu Chang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 212 days.

(21) Appl. No.: 11/115,698

(22) Filed: Apr. 26, 2005

(65) Prior Publication Data
US 2006/0238248 A1 Oct. 26, 2006

(51) Int. Cl.
H03F 3/45 (2006.01)

(52) U.S. Cl. ........................ 330/253; 330/302

(58) Field of Classification Search ................ 330/276, 330/302
See application file for complete search history.

(56) References Cited

U.S. PATENT DOCUMENTS

| 6,707,367 | B2* | 3/2004 | Castaneda et al. | 336/200 |
| 6,744,320 | B2* | 6/2004 | Nguyen et al. | 330/254 |
| 6,763,230 | B2* | 7/2004 | Cheng | 455/323 |
| 7,119,617 | B2* | 10/2006 | Rokugawa et al. | 330/253 |
| 2004/0017278 | A1 | 1/2004 | Castaneda | |
| 2004/0018823 | A1 | 1/2004 | Yang et al. | |
| 2004/0240596 | A1 | 12/2004 | Liu | |
| 2005/0062533 | A1 | 3/2005 | Vice | |

FOREIGN PATENT DOCUMENTS

EP 1280269 A 1/2003
WO WO 98/47221 10/1998

OTHER PUBLICATIONS

Choubey, B., "Design of CMOS Front End For A RF Receiver", Dept. of Electrical and Communication Engineering Regional Engineering College. Apr. 2002.
Dabrowski, J., CMOS RF Transceiver Design, 2004.
Mohan, S.S., et al., "Simple Accurate Expressions for Planar Spiral Inductances", IEEE J. of Solid-State Circuits, vol. 34, No. 10, Oct. 1999.
Yen, A., et al., "An Advanced Methodology for On-Chip Passive Component Design and Optimization", DesignCon 2005.
Zhou, J.J., et al., "Monolithic Transformers and Their Application in a Differential CMOS RF Low-Noise Amplifier", IEEE J. of Solid-State Circuits, vol. 33, No. 12, Dec. 1998.
Francesco Gatta et al., "A 2-dB Noice Figure 900-MHz Differenial CMOS LNA" IEEE J. of Solid State Circ., vol. 36, No. 10, Oct. 2001, pp. 1444-1452.
William Kuhn, "Student Designed Bluetooth Radio in Silicon-On-Sapphire", IEEE Radio Freq. Integrated Circ. Symp., 2001, pp. 107-110.

* cited by examiner

Primary Examiner—Benny T. Lee
Assistant Examiner—Alan Wong
(74) Attorney, Agent, or Firm—Blakely, Sokoloff, Taylor & Zafman LLP

(57) ABSTRACT

An embodiment of the present invention is a low noise amplifier using differential inductors. An input matching circuit having first and second differential inductors matches an input resistance at an input having input terminals. A differential amplifier circuit converts the input voltage a current. An output circuit provides an output voltage buffer with a low output impedance at an output having output terminals. A cascode circuit increases isolation between the input and the output terminals.

20 Claims, 3 Drawing Sheets

DIFFERENTIAL INDUCTOR BASED LOW NOISE AMPLIFIER

BACKGROUND

1. Field of the Invention

Embodiments of the invention relate to the field of semiconductors, and more specifically, to low noise amplifiers.

2. Description of Related Art

The front end of a radio frequency (RF) receiver typically has a low noise amplifier (LNA), a mixer, and some filters. Since the LNA is the first stage of the receiver, its performance often sets the limits on the receiver performance. Usually, the LNA exhibits a 50Ω input impedance to the antenna so as to maximize the power delivery. Differential LNAs with inductors may be employed to provide such an input matching.

However, traditional differential LNAs may have some drawbacks. A typical differential LNA generally requires six single-ended inductors, thus occupying approximately twice the silicon area, and consumes more power compared to a single-ended LNA which uses three single-ended inductors. On the other hand, single-ended LNAs have worse common-mode rejection and even-order distortions than differential LNAs.

BRIEF DESCRIPTION OF THE DRAWINGS

Embodiments of invention may best be understood by referring to the following description and accompanying drawings that are used to illustrate embodiments of the invention. In the drawings.

DESCRIPTION

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

One embodiment of the invention is a technique to design a differential LNA using three differential inductors. This design occupies approximately half the silicon area compared to a traditional differential LAN using six single-ended inductors. By employing all differential inductors, the resulting differential LNA may achieve much better common mode rejection and less second-order distortion compared to single-ended LNAs thanks to the symmetrical nature of the differential inductor structure.

Figure 1:
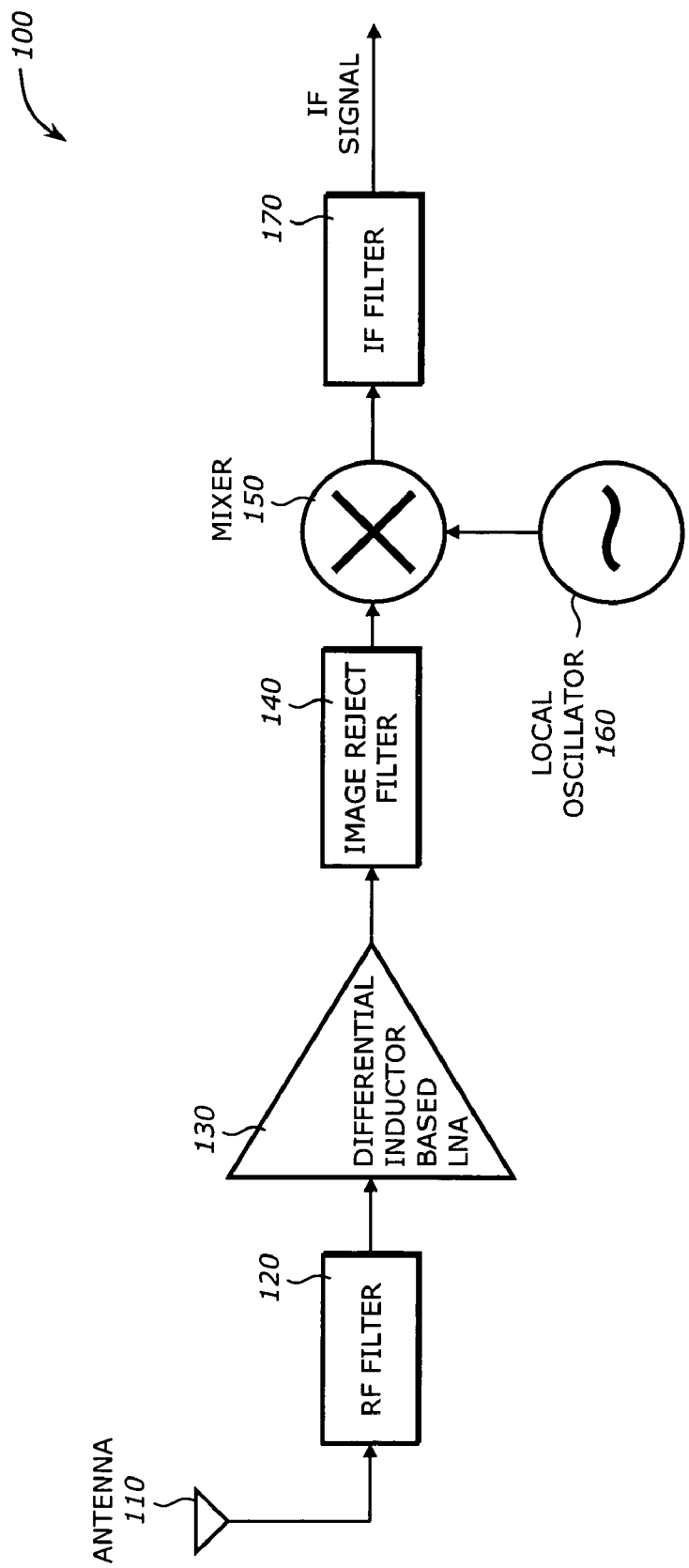
FIG. 1 is a diagram illustrating a system in which one embodiment of the invention can be practiced.

FIG. 1 is a diagram illustrating a system 100 in which one embodiment of the invention can be practiced. The system 100 includes an antenna 110, a radio frequency (RF) filter 120, a low noise amplifier (LNA) 130, an image reject filter 140, a mixer 150, a local oscillator (LO) 160, and an intermediate frequency (IF) filter 170.

The antenna 110 receives an RF signal as part of a communication system. The RF signal may be generated from any suitable sources such as mobile devices, cellular phones, etc. The RF filter 120 filters the received RF signal to eliminate any undesired noise components. In one embodiment, the RF signal is within a frequency range of up to 4 to 6 GigaHertz (GHz).

The LNA 130 provides amplification to the filtered RF input signal. It provides enough gain to reduce the noises generated in the subsequent stages while introducing as little noise as possible to the input signal. The LNA 130 preferably has a low noise figure (NF), a gain with sufficient linearity, and a proper input matching. The input matching is typically 50Ω for single-ended LNAs and 100Ω for differential LNAs. In one embodiment, the LNA 130 is a differential LNA. Differential LNAs typically have good common-mode rejection to interferences and theoretically perfect elimination of second-order harmonics compared to single-ended LNAs. The LNA 130 utilizes differential inductors to provide efficient silicon area utilization, cost reduction, and improve noise figure.

Figure 2:
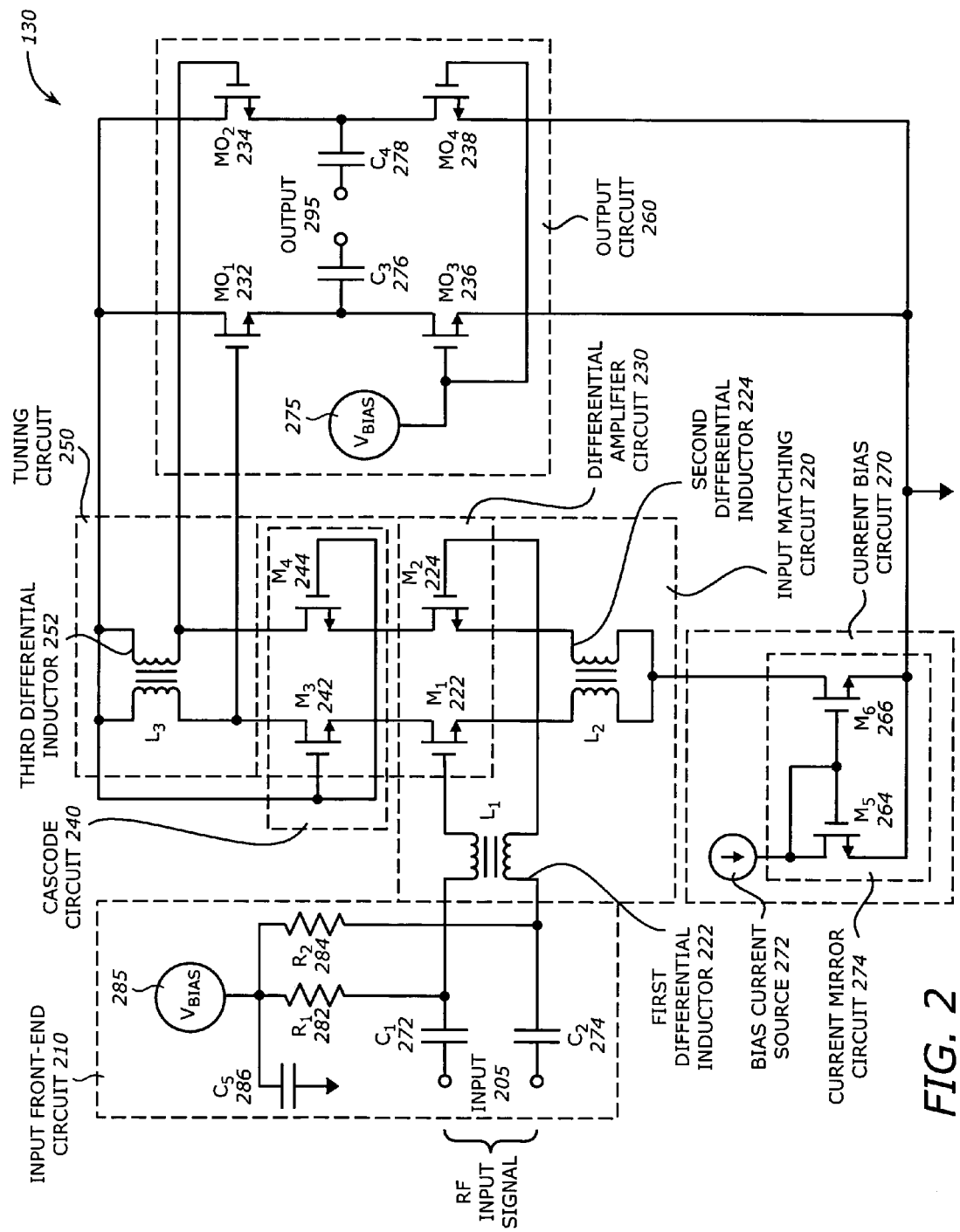
FIG. 2 is a diagram illustrating a low noise amplifier (LNA) according to one embodiment of the invention.

The image reject filter 140 attenuates the image signals that are down converted to the same intermediate frequency (IF) band as the desired RF signals, thus corrupting the original desired RF signals. The mixer 150 mixes the filtered input signal with an oscillator signal from the local oscillator 160. The oscillator signal is at a desired frequency for signal processing. The IF filter 170 filters out undesired signal components from the mixed signals and retains desired signal components at the IF frequency for further processing FIG. 2 is a diagram illustrating a low noise amplifier (LNA) 130 according to one embodiment of the invention. The LNA 130 includes an input front-end circuit 210, an input matching circuit 220, a differential amplifier circuit 230, a cascode circuit 240, a tuning circuit 250, an output circuit 260, and a current bias circuit 270. The LNA 130 has an input 205 and an output 295. The input 205 and the output 295 are differential input and output terminals, respectively.

The input front-end circuit 210 includes capacitors $C_1$ 272, $C_2$ 274, and $C_5$ 286, resistors $R_1$ 282 and $R_2$ 284, and a bias voltage source 285. The capacitors $C_1$ 272 and $C_2$ 274 are at the input 205 of the LNA 130. They are alternating current (AC) coupling capacitors that are used to isolate the different bias voltages from other circuit stages and to reduce the even-order distortion caused by large out-of-band interferences and LNA non-linearity. The capacitor $C_5$ 286 and resistors $R_1$ 282 and $R_2$ 284 are used to isolate the noise coupling from the bias voltage source 285 to the input matching circuit 220.

The input matching circuit 220 provides a matching capability. In one embodiment, this matching input resistance is 100Ω. It has first and second differential inductors $L_1$ 222 and $L_2$ 224. The first differential inductor $L_1$ 222 is connected at the differential inputs of the input 205 and to the differential amplifier circuit 230. The second differential inductor $L_2$ 224 is connected between the differential amplifier circuit 230 and the current bias circuit 270.

The differential amplifier circuit 230 is coupled to the input matching circuit 220 to convert the input voltage to an input current. It includes transistors $M_1$ 222 and $M_2$ 224. The gates of these two transistors are connected to the two differential terminals of the first differential inductor 222. The sources of these two transistors are connected to the two terminals of the differential inductor $L_2$ 224. The drains of these two transistors are connected to the cascode circuit 240. Together, the transistors $M_1$ 222 and $M_2$ 224 convert the differential input voltage to a differential input current.

The cascode circuit 240 is coupled to the differential amplifier circuit 230 and the output circuit 260 to increase the isolation between the differential amplifer circuit 230 and the output circuit 260. It includes transistors $M_3$ 242 and $M_4$ 244. The gates of these two transistors are connected to a supply voltage $V_{DD}$. Their sources are connected to the drains of the transistors $M_1$ 222 and $M_2$ 224 in the differential amplifier circuit 230. Their drains are connected to the tuning circuit 250 and the differential amplifier circuit 230.

The tuning circuit 250 includes a third differential inductor $L_3$ 252 that is essentially used to resonate with the parasitic capacitances generated from the cascode circuit 240 and the output circuit 260 at an operating frequency. In one embodiment, the operating frequency has a range of 4 to 6 GHz.

The output circuit 260 provides an output voltage buffer with a low output impedance to drive the next stage. The output circuit 260 includes first, second, third, and fourth output transistors $MO_1$ 232, $MO_2$ 234, $MO_3$ 236, and $MO_4$ 238, and two capacitors $C_3$ 276 and $C_4$ 278. The first and second output transistors $MO_1$ 232 and $MO_2$ 234 have their gates connected to the third differential inductor $L_3$ 252 in the tuning circuit 250, their drains connected to the supply voltage $V_{DD}$, and their sources providing the output 295 via the capacitors $C_3$ 276 and $C_4$ 278. The capacitors $C_3$ 276 and $C_4$ 278 are AC coupling capacitors that help to reduce the even-order distortion caused by out-of-band interferences and the LNA non-linearity. The third and fourth output transistors $MO_3$ 236 and $MO_4$ 238 have their drains coupled to the sources of the first and second output transistors $MO_1$ 232 and $MO_2$ 234, their gates connected to a second bias voltage 275, and their sources connected to a ground voltage.

The current bias circuit 270 includes a current source 272 and the current mirror circuit 274. The current source 272 provides a bias current. The current mirror circuit 274 mirrors the bias current to the differential amplifier circuit 230 and the cascode circuit 240 via the second differential inductor $L_2$ 224. The current mirror circuit 274 includes two transistors $M_5$ 264 and $M_6$ 266 connected in a current mirror configuration.

Typical values for the inductors, capacitors, and resistors for the above circuits are as follows: $C_1$=2 picoFarads (pF), $C_2$=2 pF, $C_3$=2 pF, $C_4$=2 pF, $C_5$=2 pF, $L_1$=5 nanoHenry (nH), $L_2$=0.8 nH, $L_3$=5 nH, $R_1$=$R_2$=2 KΩ. The differential inductors may be designed to have a quality factor Q larger than 11. The resulting LNA has an operating frequency range of 4 GHz to 6 GHz. The entire LNA may be implemented on-chip using Complementary Metal Oxide Semiconductor (CMOS) process or any other suitable processes, such as Gallium Arsenide (GaAs), Bipolar CMOS (BiCMOS), and Silicon Germanium (SiGe).

Figure 3:
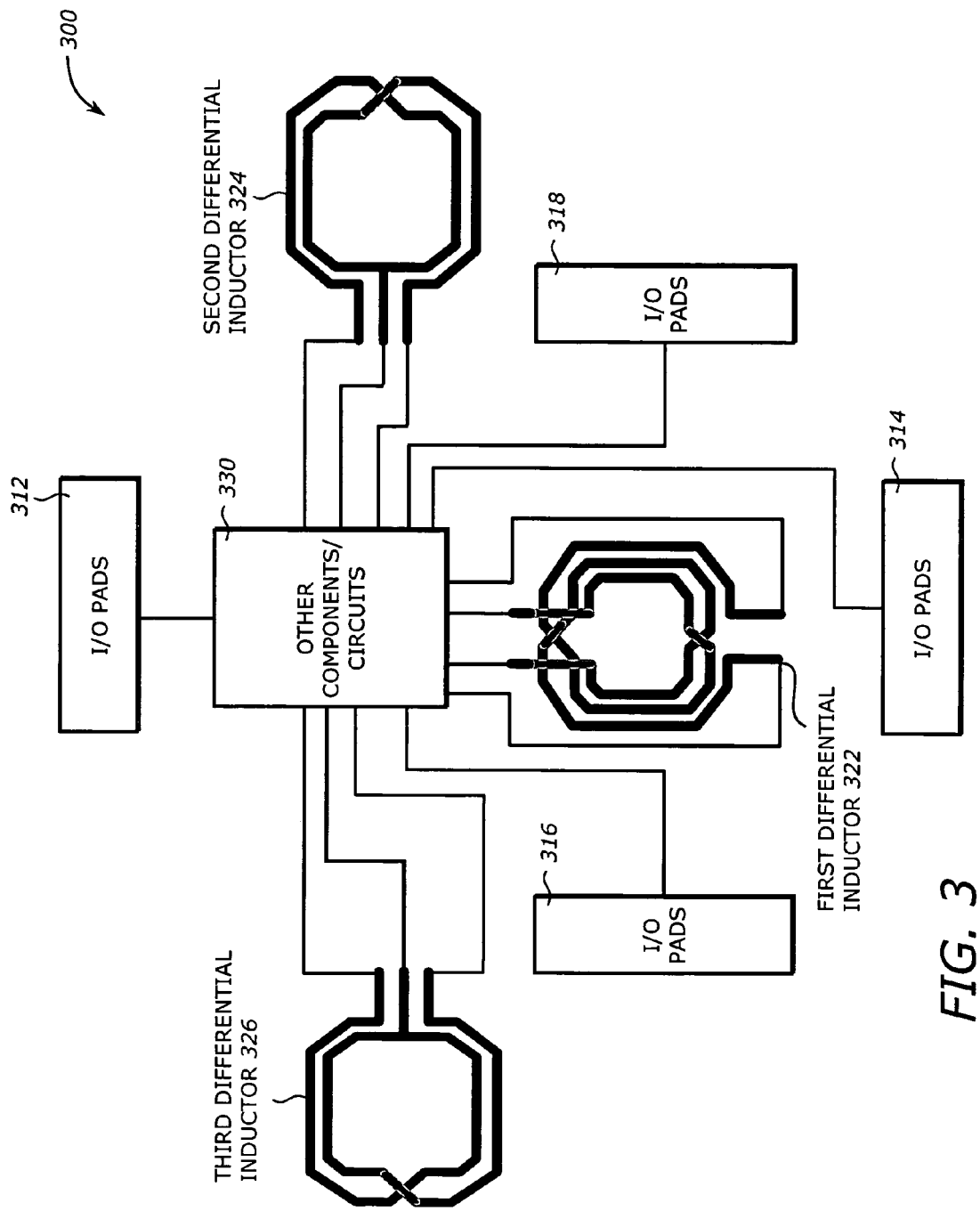
FIG. 3 is a diagram illustrating a layout of the LNA according to one embodiment of the invention.

FIG. 3 is a diagram illustrating a layout 300 of the LNA according to one embodiment of the invention. The layout 300 includes input/output pads 312, 314, 316, and 318, first, second, and third differential inductors 322, 324, and 326, and other components and circuits 330.

The I/O pads 312, 314, 316, and 318 provide pads to connect to inputs and outputs of the LNA 130. The first, second, and third differential inductors 322, 324, and 326 correspond to the first, second, and third differential inductors 222, 224, and 252, respectively, shown in FIG. 2. At least one of them has an octagonal spiral geometry. As shown in FIG. 3, all three have the octagonal spiral geometry and are configured to a differential configuration. However, the shape of the differential inductor may be circular, square, or hexagonal. The layout 322 may correspond to a two-port differential configuration. The layout 324 and 326 may correspond to the single-port differential configuration. The other components and circuits 330 correspond to the remaining circuits and components as shown in FIG. 2.

Thanks to the symmetrical configuration of the differential inductors, the resulting LNA has a much better common mode rejection and much less second-order distortions compared to a comparable LNA using single-ended inductors. In addition, geometries other than the octagonal geometry such as circular, square, and hexagonal may also be used.

Simulation for the LNA shows the following results. The noise figure (NF) is 1.8 dB, the S parameters are $S_{11}$=−24 dB, $S_{22}$=−24 dB, $S_{21}$=17 dB, and $S_{12}$=−43 dB at 5 GHz. The power dissipation is 14mW from a 1.2V power supply. The process is 90 nm RF CMOS process. The occupied physical silicon area is 0.4 mm$^2$. Compared to a traditional LNA using six single-ended inductors having similar electrical performance in terms of S parameters, this layout represents at least a 36% die reduction area, resulting in significant cost reduction.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   an input matching circuit having first and second differential inductors to match an input resistance at an input having input terminals, the input matching circuit providing an input voltage;
   a differential amplifier circuit coupled to the input matching circuit to convert the input voltage to a current;
   an output circuit to provide an output voltage buffer with a low output impedance at an output having output terminals; and
   a cascode circuit coupled to the differential amplifier circuit to increase isolation between the input and the output terminals.

2. The apparatus of claim 1 further comprising:
   a third differential inductor coupled to the cascode circuit to resonate with associated parasitic capacitances at an operating frequency.

3. The apparatus of claim 1 further comprising:
   a current source to provide a bias current; and
   a current mirror circuit coupled to the current source to mirror the bias current to bias the differential amplifier circuit.

4. The apparatus of claim 1 further comprising:
   capacitors at the input and output to separate at least a bias voltage from previous and next stages, and to reduce even-order distortion caused by out-of-band interferences and low noise amplifier (LNA) non-linearity; and
   a resistor circuit coupled to a first bias voltage source to isolate noise coupling from the first bias voltage source to the input matching circuit.

5. The apparatus of claim 2 wherein the differential amplifier circuit comprises:

first and second transistors having gates connected to the first differential inductor and sources connected to the second differential inductor.

6. The apparatus of claim 5 wherein the cascode circuit comprises:
third and fourth transistors having gates connected to a supply voltage, sources connected to drains of the first and second transistors, and drains connected to the third differential inductor.

7. The apparatus of claim 2 wherein the output circuit comprises:
first and second output transistors having gates connected to the third differential inductor, drains connected to a supply voltage, and sources providing the output; and
third and fourth output transistors having drains coupled to the sources of the first and second output transistors and gates connected to a second bias voltage.

8. The apparatus of claim 2 wherein at least one of the first, second, and third differential inductors has an octagonal spiral geometry.

9. The apparatus of claim 2 wherein the operating frequency is in a range approximately between 4 GigaHertz (GHz) and 6 GHz.

10. A method comprising:
matching an input resistance at an input having input terminals using two differential inductors, the two differential inductors providing an input voltage;
converting the input voltage to a current using a differential amplifier circuit;
providing an output voltage buffer with a low output impedance at an output having output terminals; and
increasing isolation between the input and the output terminals using a cascode circuit.

11. The method of claim 10 further comprising:
providing a third differential inductor to resonate with associated parasitic capacitances at an operating frequency.

12. The method of claim 10 further comprising:
providing a bias current using a current source; and
mirroring the bias current to bias the differential amplifier circuit.

13. The method of claim 10 further comprising:
reducing even-order distortion caused by out-of-band interferences using capacitors at the input and the output;
isolating a first bias voltage source from the input matching circuit using a resistor circuit.

14. The method of claim 11 further comprising:
placing at least one of the first, second, and third differential inductors in an octagonal spiral geometry in one of single-port and two-port configurations.

15. The method of claim 11 wherein providing comprises:
providing the third differential inductor to resonate at the operating frequency in a range approximately between 4 GigaHertz (GHz) and 6 GHz.

16. A system comprising:
a radio frequency (RF) filter coupled to an antenna to receive an RF input signal;
a low noise amplifier (LNA) coupled to the RF filter to amplify the RF input signal, the LNA comprising:
an input matching circuit having first and second differential inductors to match an input resistance at an input having input terminals, the input matching circuit providing an input voltage,
a differential amplifier circuit coupled to the input matching circuit to convert the input voltage to a current,
an output circuit to provide an output voltage buffer with a low output impedance at an output having output terminals, and
a cascode circuit coupled to the differential amplifier circuit to increase isolation between the input and the output terminals;
an image reject filter coupled to the LNA to attenuate image signal, and prevent the image signal from corrupting desired RF signal;
a mixer coupled to the image reject filter to mix the RF signal with an oscillator signal from a local oscillator; and
an intermediate frequency (IF) filter coupled to the mixer to extract a desired IF signal from the mixed signals.

17. The system of claim 16 wherein the LNA further comprises:
a third differential inductor coupled to the cascode circuit to resonate with associated parasitic capacitances at an operating frequency.

18. The system of claim 16 wherein the LNA further comprises:
a current source to provide a bias current; and
a current mirror circuit coupled to the current source to mirror the bias current to bias the differential amplifier circuit.

19. The system of claim 17 wherein at least one of the first, second, and third differential inductors have an octagonal spiral geometry.

20. The system of claim 17 wherein the operating frequency is in a range of approximately 4 GigaHertz (GHz) to 6 GHz.

* * * * *